(12) United States Patent
Fujisawa et al.

(10) Patent No.: US 10,077,339 B2
(45) Date of Patent: Sep. 18, 2018

(54) CURABLE ORGANOPOLYSILOXANE COMPOSITION, AND PROTECTIVE-AGENT OR ADHESIVE-AGENT COMPOSITION FOR ELECTRICAL/ELECTRONIC COMPONENTS

(71) Applicant: Dow Corning Toray Co., Ltd., Tokyo (JP)

(72) Inventors: Toyohiko Fujisawa, Chiba (JP); Tomoko Kato, Chiba (JP); Harumi Kodama, Chiba (JP); Masayuki Onishi, Chiba (JP)

(73) Assignee: Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 15/302,563

(22) PCT Filed: Mar. 26, 2015

(86) PCT No.: PCT/JP2015/001764
§ 371 (c)(1),
(2) Date: Nov. 30, 2016

(87) PCT Pub. No.: WO2015/155950
PCT Pub. Date: Oct. 15, 2015

(65) Prior Publication Data
US 2017/0121462 A1 May 4, 2017

(30) Foreign Application Priority Data

Apr. 9, 2014 (JP) .................................. 2014-079874

(51) Int. Cl.
*C08G 77/20* (2006.01)
*H05K 5/06* (2006.01)
*C08K 3/36* (2006.01)
*C08K 3/22* (2006.01)
*C09J 183/04* (2006.01)
*C08G 77/12* (2006.01)

(52) U.S. Cl.
CPC ............. *C08G 77/20* (2013.01); *C08G 77/12* (2013.01); *C08K 3/22* (2013.01); *C08K 3/36* (2013.01); *C09J 183/04* (2013.01); *H05K 5/06* (2013.01); *C08K 2003/2227* (2013.01)

(58) Field of Classification Search
None
See application file for complete search history.

(56) References Cited

U.S. PATENT DOCUMENTS

| | | | |
|---|---|---|---|
| 3,837,876 A | 9/1974 | Mayuzumi et al. | |
| 4,652,624 A * | 3/1987 | Allen | C09K 3/1018 524/860 |
| 4,898,910 A | 2/1990 | Kamis et al. | |
| 5,053,442 A | 10/1991 | Chu et al. | |
| 5,504,174 A * | 4/1996 | Onishi | C08L 83/04 525/478 |
| 5,625,022 A * | 4/1997 | Onishi | C08L 83/04 525/478 |
| 5,804,631 A | 9/1998 | Mine et al. | |
| 5,872,170 A * | 2/1999 | Mine | C08L 83/04 522/99 |
| 5,981,682 A * | 11/1999 | Onishi | C09J 183/04 524/847 |
| 6,040,362 A * | 3/2000 | Mine | C08K 9/02 523/200 |
| 6,235,832 B1 * | 5/2001 | Deng | C08L 83/04 524/492 |
| 6,306,957 B1 | 10/2001 | Nakano et al. | |
| 7,662,479 B2 * | 2/2010 | Ikeno | B60R 21/235 428/447 |
| 7,781,560 B2 * | 8/2010 | Ushio | C08L 83/04 524/288 |

(Continued)

FOREIGN PATENT DOCUMENTS

JP S528854 B2 3/1977
JP S5458757 A 5/1979

(Continued)

OTHER PUBLICATIONS

PCT/JP2015/001764 International Search Report dated Jun. 23, 2015, 3 pages.
English language abstract and machine translation for JPS5458757 (A) extracted from http://worldwide.espacenet.com database on Nov. 1, 2016, 8 pages.
English language abstract and machine translation for JPH10195085 (A) extracted from http://worldwide.espacenet.com database on Nov. 1, 2016, 21 pages.

(Continued)

*Primary Examiner* — Robert S Loewe
(74) *Attorney, Agent, or Firm* — Warner Norcross & Judd LLP

(57) ABSTRACT

A curable organopolysiloxane composition that can achieve excellent initial adhesion improvement effects towards various types of substrates, and a protective agent or adhesive composition for electric and electronic components, are provided. The curable organopolysiloxane composition comprises (A) either i) (a1) an organopolysiloxane having a specific alkoxysilyl-containing group and at least an average of 0.5 alkenyl groups, or ii) a mixture of (a1) and (a2) an organopolysiloxane that has at least two alkenyl groups in a molecule, and that does not have the aforementioned group having an alkoxysilyl group. In the mixture, the amount of component (a1) is 10 to less than 100 mass %. The curable organopolysiloxane composition further comprises (B) an organopolysiloxane having at least two silicon-bonded hydrogen atoms in each molecule, (C) a catalyst for a hydrosilylation reaction, and (D) a catalyst for a condensation reaction.

18 Claims, No Drawings

(56) References Cited

U.S. PATENT DOCUMENTS

| | | | | |
|---|---|---|---|---|
| 8,119,758 B2* | 2/2012 | Sakurai | ............... | C09J 183/04 |
| | | | | 528/10 |
| 2003/0105206 A1* | 6/2003 | Hara | ............... | C08K 3/08 |
| | | | | 524/439 |
| 2004/0242762 A1* | 12/2004 | Horikoshi | ............... | C08L 83/04 |
| | | | | 524/588 |
| 2009/0105441 A1 | 4/2009 | Ushio et al. | | |
| 2011/0301276 A1* | 12/2011 | Katayama | ............... | C08J 3/243 |
| | | | | 524/493 |
| 2012/0123051 A1 | 5/2012 | Kuwata | | |
| 2014/0066570 A1 | 3/2014 | Kodama et al. | | |

FOREIGN PATENT DOCUMENTS

| | | | |
|---|---|---|---|
| JP | H02133490 A | 5/1990 | |
| JP | H0797519 A | 4/1995 | |
| JP | H10195085 A | 7/1998 | |
| JP | 2000256558 A | 9/2000 | |
| JP | 2002170978 A | 6/2002 | |
| JP | 2006348119 A | 12/2006 | |
| JP | 2007235013 A | 9/2007 | |
| JP | 2009135105 A | 6/2009 | |
| JP | 201126523 A | 2/2011 | |
| JP | 2012204016 A | 10/2012 | |
| JP | 2012219113 A | 11/2012 | |
| JP | 2013209517 A | 10/2013 | |

OTHER PUBLICATIONS

English language abstract and machine translation for JP2002170978 (A) extracted from http://worldwide.espacenet.com database on Nov. 1, 2016, 18 pages.

English language abstract and machine translation for JP2007235013 (A) extracted from http://worldwide.espacenet.com database on Nov. 1, 2016, 19 pages.

English language abstract and machine translation for JP2009135105 (A) extracted from http://worldwide.espacenet.com database on Nov. 1, 2016, 15 pages.

English language abstract and machine translation for JP2012204016 (A) extracted from http://worldwide.espacenet.com database on Nov. 1, 2016, 17 pages.

English language abstract and machine translation for JP2013209517 (A) extracted from http://worldwide.espacenet.com database on Nov. 1, 2016, 31 pages.

* cited by examiner

CURABLE ORGANOPOLYSILOXANE COMPOSITION, AND PROTECTIVE-AGENT OR ADHESIVE-AGENT COMPOSITION FOR ELECTRICAL/ELECTRONIC COMPONENTS

CROSS-REFERENCE TO RELATED APPLICATIONS

This application is the National Stage of International Application No. PCT/JP2015/001764 filed on 26 Mar. 2015, which claims priority to and all advantages of Japanese Patent Application No. 2014-079874 filed on 9 Apr. 2014, the content of which is hereby incorporated by reference.

TECHNICAL FIELD

The present invention relates to a curable organopolysiloxane composition with excellent adhesion to various types of substrates and that easily cures by heating to a temperature between room temperature and 50° C. or lower, and also relates to a protective agent or adhesive composition for electric and electronic components made from the curable organopolysiloxane composition, and relates to electric and electronic apparatuses made by sealing the electric and electronic components using the curable organopolysiloxane composition.

BACKGROUND ART

Curable organopolysiloxane compositions are widely used as protective agent compositions for electric and electronic components, but protective materials are required to demonstrate excellent self-adhesive properties toward substrate that are in contact during curing, from the perspective of durability and reliability. For example, the present applicants have proposed a curable organopolysiloxane composition that undergoes hydrosilylation reaction curing that contains an organopolysiloxane with a specific alkoxysilyl group and an alkenyl group in one molecule, with excellent adhesion toward unwashed aluminum diecast or the like, and that cures by heating to approximately 100° C. (Patent literature 1). Furthermore, the same document mentions that a titanium compound or the like can be used as a catalyst for promoting adhesion. However, the aforementioned curable organopolysiloxane composition is a hydrosilylation reaction curing composition, and curing will not occur unless heated to approximately 100° C., and there is still room for improvement for adhesion to various types of substrates.

On the other hand, the present applicants have proposed a room temperature curing silicone rubber composition that jurors at room temperature by contact with moisture in the air and that demonstrates favorable adhesion to substrates that are in contact during curing, wherein the room temperature curable silicone rubber composition contains a diorganopolysiloxane with a specific alkoxysilyl group such as a group containing trimethoxysilyl ethyl, an organopolysiloxane that does not contain an alkoxysilyl group or a hydroxyl group, alkoxysilane which is a cross-linking agent, or a hydrolysate thereof, and a condensation reaction catalyst (Patent literature 2). However, the room temperature curable silicone rubber composition of patent document 2 has insufficient curing rate at room temperature, and there is still room for improvement for adhesion to various types of substrates.

CITATION LIST

Patent Literature

Patent Document 1: Japanese Unexamined Patent Application Publication No. 2006-348119

Patent Document 2: Japanese Unexamined Patent Application Publication No. 2012-219113

SUMMARY OF INVENTION

Problem to be Solved by the Invention

An object of the present invention is to resolve the aforementioned problems and to provide a curable organopolysiloxane unlike conventional curable organopolysiloxane compositions that can easily cure by heating to a temperature between room temperature and 50° C. or lower, has an excellent effect of improving the initial adhesion towards various types of substrates that are in contact during curing, particularly unwashed aluminum diecast and organic resins such as polybutylene terephthalate (PBT) resin, polyphenylene sulfide (PPS) resin, and the like, and that can provide excellent adhesive strength after curing.

In particular, an object of the present invention is to provide a protective agent or adhesive composition for electric and electronic components that is curable between room temperature and 50° C. with excellent initial adhesion and adhesion durability toward aluminum diecast and resin materials, and that can maintain the reliability and durability of the electric and electronic components for a long period of time, by using the aforementioned polysiloxane composition. Furthermore, an object of the present invention is to provide these electric and electronic components with excellent reliability and durability.

Solution to Problem

As a result of extensive research, the present inventors discovered that the aforementioned problems can be resolved by a curable organopolysiloxane composition containing the following components (A) through (D), and thus achieved the present invention. (A) 100 mass parts of (a1) an organopolysiloxane having in a molecule at least an average of 0.5 alkenyl groups and a group having an alkoxysilyl group with at least one silicon atom bond expressed by the general formula:

[Formula 1]

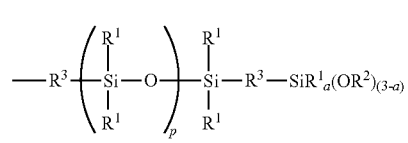

(wherein $R^1$ represent the same or different monovalent hydrocarbon group without an aliphatic unsaturated bond, $R^2$ represents an alkyl group, $R^3$ represent the same or different alkylene group, a represents an integer from 0 to 2, and p represents an integer from 1 to 50) or a mixture of the component (a1) and (a2) an organopolysiloxane that has at least 2 alkenyl groups in a molecule, and that does not have the aforementioned group having an alkoxysilyl group {the amount of component (a1) in the mixture is 10 to 100 mass % (however not including 100 mass %)} (B) an organopolysiloxane having at least two silicon-bonded hydrogen atoms in each molecule {in a quantity whereby an amount of silicon-bonded hydrogen atoms in the composition is 0.3 to 20 with regard to one alkenyl group in component (A), (C) a catalytic amount of a catalyst for a hydrosilylation reaction, and (D) a catalytic amount of a catalyst for a condensation reaction Furthermore, the present inventors discovered that the aforementioned problems can be more favorably resolved by a curable organopolysiloxane composition containing the following component (E) an adhesion promoter containing the following (e1) through (e3), and thus achieved the present invention. (e1) 100 mass parts of a reaction mixture of an organoalkoxysilane having an amino group and an organoalkoxysilane having an epoxy group; (e2) 10 to 800 mass parts of an organic compound having at least two alkoxysilyl groups in a molecule and having a bond other than a silicone-oxygen bond between these silyl groups; and (e3) 10 to 800 mass parts of a silane having an epoxy group expressed by the general formula: $R^a{}_n Si(OR^b)_{4-n}$ (where $R^a$ represents an organic group having a monovalent epoxy group, $R^b$ represents a hydrogen atom or an alkyl group having 1 to 6 carbon atoms. n represents a number within a range of 1 to 3), or a partially hydrolyzed condensate thereof.

In other words, an object of the present invention is achieved by the following curable organopolysiloxane composition. [1] A curable organopolysiloxane composition containing the following components (A) through (D). (A) 100 mass parts of (a1) an organopolysiloxane having in a molecule at least an average of 0.5 alkenyl groups and a group having an alkoxysilyl group with at least one silicon atom bond expressed by the general formula:

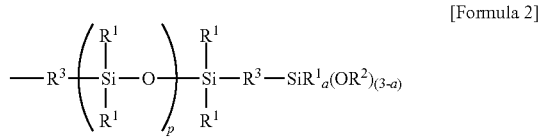

[Formula 2]

(wherein $R^1$ represent the same or different monovalent hydrocarbon group without an aliphatic unsaturated bond, $R^2$ represents an alkyl group, $R^3$ represent the same or different alkylene group, a represents an integer from 0 to 2, and p represents an integer from 1 to 50) or a mixture of the component (a1) and (a2) an organopolysiloxane that has at least 2 alkenyl groups in a molecule, and that does not have the aforementioned group having an alkoxysilyl group {the amount of component (a1) in the mixture is 10 to 100 mass % (however not including 100 mass %)} (B) an organopolysiloxane having at least two silicon-bonded hydrogen atoms in each molecule {in a quantity whereby an amount of silicon-bonded hydrogen atoms in the composition is 0.3 to 20 with regard to 1 alkenyl group in component (A), (C) a catalytic amount of a catalyst for a hydrosilylation reaction, and (D) a catalytic amount of a catalyst for a condensation reaction

[2] A curable organopolysiloxane composition as described in [1], further containing (E) an adhesion promoter containing the following (e1) through (e3). (e1) 100 mass parts of a reaction mixture of an organoalkoxysilane having an amino group and an organoalkoxysilane having an epoxy group; (e2) 10 to 800 mass parts of an organic compound having at least two alkoxysilyl groups in a molecule and having a bond other than a silicone-oxygen bond between these silyl groups; and $R^a{}_n Si(OR^b)_{4-n}$ (where $R^a$ represents an organic group having a monovalent epoxy group, $R^b$ represents a hydrogen atom or an alkyl group having 1 to 6 carbon atoms. n represents a number within a range of 1 to 3), or a partial hydrolysate condensate thereof.

[3] A curable organopolysiloxane composition according to [1] or [2], wherein component (a1) is a straight chain organopolysiloxane composition where the group having an alkoxysilyl is bonded to both terminals of the molecular chain and to a silicon atom in a molecular side chain. [4] The curable organopolysiloxane composition according to any one of [1] through [3], wherein the group having an alkoxysilyl group in the component (a1 is a group represented by formula:

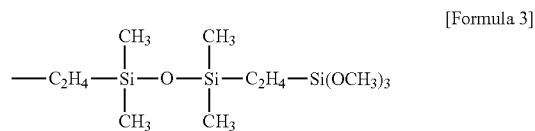

[Formula 3]

[5] The curable organopolysiloxane composition described in any one of [1] to [4], further comprising (F) an inorganic filler. [6] The curable organopolysiloxane composition according to any one of [1] to [5], which is room temperature curable. [7] The curable organopolysiloxane composition according to any one of [1] to [6], which is a two-component type curable organopolysiloxane composition. [8] The two-component type curable organopolysiloxane composition according to [7], wherein liquid component I contains at least component (C) and component (D), and optionally component (a2), and liquid component II contains at least component (A) and component (B).

Furthermore, an object of the present invention is achieved by [9] a protective agent or adhesive composition for electric and electronic components, comprising a curable organopolysiloxane composition according to any one of [1] to [8]; and [10] an electric or electronic apparatus, made by sealing or enclosing electric or electronic components using the curable organopolysiloxane composition according to any one of claims 1 to 8.

Incidentally, an object of the present invention can be achieved by using the curable organopolysiloxane composition as a protective agent or adhesive composition for electric and electronic components. Similarly, an object of the present invention can be achieved by a method of protecting or adhering an electric or electronic component by the curable organopolysiloxane composition, or an electric or electronic apparatus provided with a cured material of the curable organopolysiloxane composition.

Advantageous Effects of Invention

The curable organopolysiloxane composition of the present invention provides a curable organopolysiloxane that can easily cure by heating to a temperature between room temperature and 50° C. or lower, has an excellent effect of improving the initial adhesion towards various types of substrates that are in contact during curing, particularly unwashed aluminum diecast and organic resins such as polybutylene terephthalate (PBT) resin, polyphenylene sulfide (PPS) resin, and the like, and that can provide excellent adhesive strength after curing.

Furthermore, a protective agent or adhesive composition for electric and electronic components that is curable between room temperature and 50° C. with excellent initial adhesion and adhesion durability toward aluminum diecast and resin materials, and that can maintain the reliability and durability of the electric and electronic components for a long period of time, by using the aforementioned curable organopolysiloxane composition of the present invention.

Furthermore, the present invention can provide these electric and electronic components with excellent reliability and durability.

DESCRIPTION OF EMBODIMENTS

The curable organopolysiloxane composition of the present invention is a dual curing type composition containing an organopolysiloxane containing a specific alkoxysilyl group and an alkenyl group in a molecule, an organopolysiloxane which is a cross-linking agent containing at least 2 or more silicon atom-bonded hydrogen atoms in a molecule, and both a catalyst for a hydrosilylation reaction and a catalyst for a condensation reaction. The alkoxysilyl group is condensation reaction curable, and the alkenyl group is a functional group that can cure by a hydrosilylation reaction with the silicon atom-bonded hydrogen atoms, and an organopolysiloxane that contains both of these function groups in one molecule can be easily cured at room temperature by heating to a temperature between room temperature and 50° C. by causing a reaction in the presence of 2 different types of catalysts. A detailed description thereof is given hereinafter.

Component (A) is (a1) an organopolysiloxane having in a molecule at least an average of 0.5 alkenyl groups and a group having an alkoxysilyl group with at least one silicon atom bond expressed by the general formula:

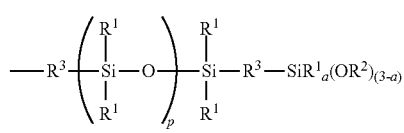

[Formula 4]

(wherein $R^1$ represent the same or different monovalent hydrocarbon group without an aliphatic unsaturated bond, $R^2$ represents an alkyl group, $R^3$ represent the same or different alkylene group, a represents an integer from 0 to 2, and p represents an integer from 1 to 50) or a mixture of the component (a1) and (a2) an organopolysiloxane that has at least 2 alkenyl groups in a molecule, and that does not have the aforementioned group having an alkoxysilyl group {the amount of component (a1) in the mixture is 10 to 100 mass % (however not including 100 mass %)} Therefore, component (A) can be component (a1) alone, or a mixture with component (a2), but must contain 10 mass % or more of component (a1) based on the total amount. Furthermore, if an organopolysiloxane that has the aforementioned alkoxysilyl group but does not have an alkenyl group in the molecule is used, the technical effects of the present invention cannot be realized, even if used in combination with component (a2).

Component (a1) is an organopolysiloxane with at least a group containing alkoxysilyl expressed by the aforementioned general formula bonded to one silicon atom and at least an average of 0.5 alkenyl groups in one molecule, and is a component that provides excellent low temperature adhesion to the main composition. In the formula, $R^1$ can be the same or different monovalent hydrocarbon group without an aliphatic unsaturated bond, examples of which include alkyl groups such as a methyl group, ethyl group, propyl group, butyl group, pentyl group, hexyl group, heptyl group, octyl group, nonyl group, decyl group, and octadecyl group; cycloalkyl groups such as a cyclopentyl group and cyclohexyl group; aryl groups such as a phenyl group, tolyl group, xylyl group, and naphthyl group; aralkyl groups such as a benzyl group, phenylethyl group, and phenylpropyl group; and halogenated alkyl groups such as a 3-chloropropyl group and 3,3,3-trifluoropropyl group. An alkenyl group, or aryl group is preferred, and a methyl group or phenyl group is particularly preferred. Furthermore, the formula, $R^2$ is an alkyl group such as a methyl group, ethyl group, propyl groups, butyl group, pentyl group, and hexyl group, with a methyl group being preferable. $R^3$ can be the same or different bivalent function group, and examples include alkylene group such as ethylene groups, propylene groups, butylene groups, pentylene groups, hexylene groups, heptylene groups, and octylene groups; and alkylene oxyalkylene groups such as ethyleneoxyethylene, propyleneoxyethylene groups, and propyleneoxypropylene groups, preferably alkylene groups, and particularly preferably ethylene groups. Furthermore, in the formula, p is an integer from 1 to 50, preferably an integer from 1 to 10, and particularly preferably an integer from 1 to 5. Furthermore, in the formula, a is an integer from 0 to 2, and preferably 0.

Examples of the alkoxysilyl-containing groups include groups containing alkoxysilyl expressed by the following general formulas, and examples include the groups represented by:

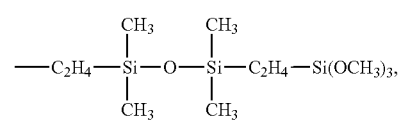

[Formula 5]

groups represented by the formula:

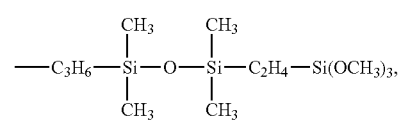

[Formula 6]

groups represented by the formula:

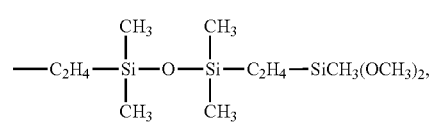

[Formula 7]

groups represented by the formula:

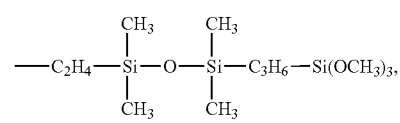

[Formula 8]

groups represented by the formula:

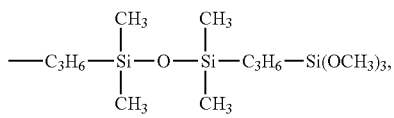
[Formula 9]

groups represented by the formula:

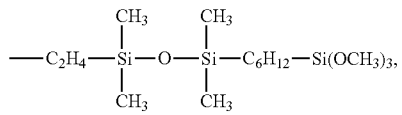
[Formula 10]

groups represented by the formula:

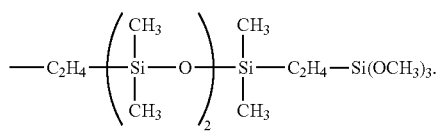
[Formula 11]

Furthermore, examples of the alkenyl groups in the component (a1) include vinyl groups, allyl groups, butenyl groups, pentenyl groups, and hexenyl groups. Of these, vinyl groups are preferable. Examples of organic groups that are bonded to a silicon atom other than the alkenyl group in component (a1) include the same alkyl groups as $R^2$, cycloalkyl groups, aryl groups, aralkyl groups, halogenated alkyl groups, and other monovalent hydrocarbon groups that do not have an aliphatic unsaturated bond, preferably alkyl groups, and aryl groups, and particularly preferably methyl groups and phenyl groups.

Component (a1) has at least one alkoxysilyl-containing group in the molecule, but this composition preferably contains 2 or more of such groups in the molecule in order to demonstrate higher adhesion. Furthermore, the upper limit for the number of alkoxysilyl-containing groups in the molecule is not particularly restricted, but is preferably 20 or fewer. This is because if the number of alkoxysilyl-containing groups in the molecule exceeds 20, significantly improving the adhesion cannot be expected. Furthermore, the bonding position of the alkoxysilyl-containing group is not restricted, and can be on a terminal of the molecular chain, or on a molecular sidechain. Furthermore, component (a1) must have at least an average of 0.5 alkenyl groups in the molecule, and this is because if the number of alkenyl groups in one molecule is less than an average of 0.5, the composition that is obtained will not have sufficient curing, and there is a concern that the physical properties of the cured substance that is obtained will be inferior. The upper limit for the number of alkenyl groups in the molecule is not particularly restricted, but is preferably 20 or fewer. This is because if the number of alkenyl groups in the molecule exceeds 20, significantly improving the adhesion and physical properties cannot be expected. Furthermore, the bonding position of the alkenyl group is not restricted, and can be on a terminal of the molecular chain, or on a molecular sidechain.

There is no limitation upon the molecular structure of the component (a1), and examples include straight chain, partially branched straight chain, branched chain, dendritic, or reticulated. The component (a1) may be a mixture of organopolysiloxanes having these molecular structures. In particular, component (a1) is preferably a straight-chain organopolysiloxane where the aforementioned alkoxysilyl-containing group is bonded to both terminals of the molecular chain and to a silicon atom on a side-chain. The viscosity at 25° C. of the component (a1) is not particularly limited but is preferably 20 mPa·s or higher, and particularly preferably within the range of from 100 to 1,000,000 mPa·s. This is because if the viscosity is low, the physical properties of the cured material that is obtained, particularly the flexibility and elasticity, will be significantly reduced.

An example of this type of component (a1) is an organopolysiloxane expressed by the average unit formula:

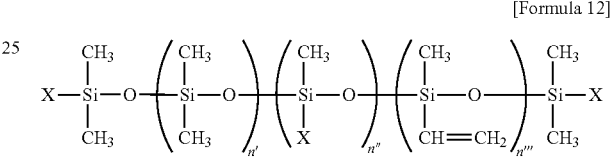
[Formula 12]

an organopolysiloxane expressed by the average unit formula:

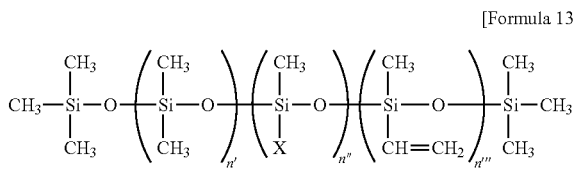
[Formula 13]

an organopolysiloxane expressed by the average unit formula:

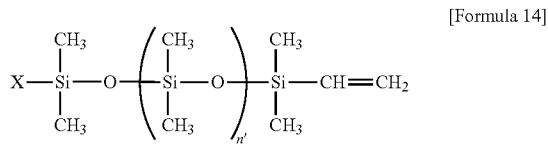
[Formula 14]

and the organopolysiloxane expressed by the average unit formula $[(CH_3)_3SiO_{1/2}]_b[(CH_3)_2(CH_2\!=\!CH)SiO_{1/2}]_c[(CH_3)_2 XSiO_{1/2}]_d(SiO_{4/2})_e$. Incidentally, in the formula, X represents a group containing alkoxysilyl, and n', n", and n'" each represent integers of 1 or higher, and b, c, d, and e are normal numbers.

These (a1) components can be produced by a hydrosilylation reaction of an organopolysiloxane having an alkenyl group with less than an equivalent amount with regard to the alkenyl group, of a siloxane having an alkoxysilyl group expressed by the general formula:

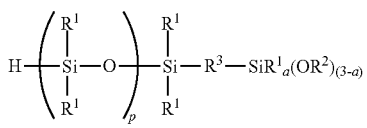

[Formula 15]

in the presence of a catalyst for a hydrosilylation reaction. In the above formula, $R^1$, $R^2$, $R_3$ and p and a are the same as defined above. Incidentally, if siloxane having an alkoxysilyl in an equivalent amount as the alkenyl groups or more is reacted with an organopolysiloxane having an alkenyl group, an organopolysiloxane having an alkoxysilyl group and having at least an average of 0.5 alkenyl groups cannot be obtained. Furthermore, if an organopolysiloxane that has the aforementioned alkoxysilyl group but does not have an alkenyl group in the molecule is used in place of component (a1) of the present invention, the technical effects of the present invention cannot be realized, even if used in combination with component (a2).

Component (a2) is an optional component for supplementing curing of the present composition if the present composition is not sufficiently cured using only component (a1), and is an organopolysiloxane having at least two alkenyl groups in one molecule, but not having a group containing an alkoxysilyl. Examples of the alkenyl groups in the component (a2) include vinyl groups, allyl groups, butenyl groups, pentenyl groups, and hexenyl groups. Of these, vinyl groups are preferable. The bonding position of the alkenyl group is not particularly restricted, and examples include the molecular chain terminals and molecular sidechains, but the molecular chain terminal is particularly preferable. Examples of organic groups that are bonded to a silicon atom other than the alkenyl group in component (a2) include the same alkyl groups as $R^1$, cycloalkyl groups, aryl groups, aralkyl groups, halogenated alkyl groups, and other monovalent hydrocarbon groups that do not have an aliphatic unsaturated bond, preferably alkyl groups and aryl groups, and particularly preferably methyl groups and phenyl groups. The molecular structure of component (a2) is not particularly restricted, and examples include straight chain, partially branched straight chain, branched chain, cyclic, dendritic, or reticulated. The component (a2) may be a mixture of two or more types having these molecular structures. In particular, the molecular structure of component (a2) is preferably a straight chain. The viscosity at 25° C. of component (a2) is not particularly limited, but is preferably within a range of 20 to 1,000,000 mPa·s, and particularly preferably within a range of 100 to 100,000 mPa·s. This is because there is a possibility that the physical properties of the obtained cured product, and especially the flexibility and elasticity may be significantly inferior if the viscosity at 25° C. is below the lower limit of this range, but on the other hand, if the upper limit of this range is exceeded, the viscosity of the composition that is obtained will be high, and there is a possibility that handling and workability will be significantly inferior.

Examples of component (a2) include dimethylsiloxane-methylvinylsiloxane copolymers capped at both molecular terminals with trimethylsiloxy groups, dimethylsiloxane-methylvinylsiloxane-methylphenylsiloxane copolymers capped at both molecular terminals with trimethylsiloxy groups, dimethylpolysiloxanes capped at both molecular terminals with dimethylvinylsiloxy groups, methylphenylpolysiloxanes capped at both molecular terminals with dimethylvinylsiloxy groups, dimethylsiloxane-methylvinylsiloxane copolymers capped at both molecular terminals with dimethylphenylsiloxy groups, and dimethylpolysiloxane capped at both molecular terminals with methylvinylphenylsiloxy groups.

Component (a2) is an optional component for supplementing curing of the present composition if the present composition does not sufficiently cure using only component (a1), and therefore the amount that is added is arbitrary, but when used in combination with component (a1), the amount of component (a2) is within a range of 0 to 90 mass % (but not including 0 mass %) in the mixture of component (a1) and component (a2), or in other words, the amount of component (a1) is 10 to 100 mass % (but not including 100 mass %).

Component (B) is a crosslinking agent of the present composition and is an organopolysiloxane having at least 2 silicon-bonded hydrogen atoms in a molecule. Examples of organic groups that are bonded to a silicon atom in component (B) include the same alkyl groups as $R^2$, as well as cycloalkyl groups, aryl groups, aralkyl groups, halogenated alkyl groups, and other monovalent hydrocarbon groups that do not have an aliphatic unsaturated bond, preferably alkyl groups and aryl groups, and particularly preferably methyl groups and phenyl groups. The molecular structure of component (B) is not restricted, but examples include straight-chain, partially branching straight-chain, branched-chain, cyclic, web-shaped, and dendritic structures, but straight-chain is preferable. The viscosity at 25° C. of component (B) is not particularly restricted, but, the viscosity is preferably in a range of 1 to 10,000 mPa·s.

Examples of component (B) include methylhydrogen polysiloxane having trimethylsiloxy groups capping both molecular chain terminals, methylhydrogensiloxane-dimethylsiloxane copolymer having trimethylsiloxy groups capping both molecular chain terminals, methylhydrogensiloxane-dimethylsiloxane copolymer having dimethylhydrogensiloxy groups capping both molecular chain terminals, and mixtures of two or more such types of these organopolysiloxane compounds. With the present invention, the point that component (B) is a mixture of a methyl hydrogen siloxane and dimethyl siloxane copolymer capped with a trimethyl siloxy group on both terminals of the molecular chain and a dimethyl polysiloxane capped with a dimethyl hydrogen siloxy group on both terminals of the molecular chain is particularly preferable from the perspective of improving the initial adhesion and the adhesive durability towards aluminum diecast and resin materials.

The amount of component (B) is an amount such that the number of hydrogen atoms bonded to a silicon atom in this component is 0.3 to 20, with regard to one alkenyl group in component (A). This is because the composition will not cure sufficiently if the amount of component (B) is less than the lower limit of the aforementioned range, but on the other hand, problems such as generation of hydrogen gas from the composition obtained during curing may occur, or the heat resistance of the cured product obtained may be greatly reduced, if the amount exceeds the upper limit of the aforementioned range. Generally, the aforementioned conditions can be achieved if the amount of component (B) is within a range of 0.5 to 50 mass parts with regard to 100 mass parts of component (A).

The curable organopolysiloxane composition of the present invention contains, in addition to component (A) and component (B), two different types of curing catalyst, namely (C) a catalytic amount of a catalyst for hydrosilylation reactions, and (D) a catalytic amount of a catalyst for condensation reactions. By using these two types of catalysts in combination with components (A) and (B), curing can easily be achieved by heating to a temperature between room temperature and 50° C. or lower, and the technical effect of achieving excellent adhesion to various types of substrates can be achieved.

Component (C) is a component for promoting the hydrosilylation reaction and curing the composition. Examples of this component include platinum-based catalysts such as platinum black, platinum-supported activated carbon, platinum-supported silica powder, chloroplatinic acid, alcohol solutions of chloroplatinic acids, olefin complexes of platinum, and vinylsiloxane complexes of platinum, and the like; palladium-based catalysts such as tetrakis(triphenylphosphine)palladium; and rhodium-based catalysts. In particular, component (C) is preferably a platinum hydrosilylation reaction catalyst. The amount used is a catalytic amount, and can be appropriately selected to match the desired curing conditions, but is generally within a range of approximately 1 to 1000 ppm, based on the amount of organopolysiloxane.

Component (D) is used in combination with component (C) and can improve the curing properties as well as the adhesion to various types of substrates when the composition is heated to a temperature between room temperature and 50° C. or lower. Specifically, component (D) is a catalytic amount of a condensation reaction catalyst, and induces curing by promoting condensation reactions of organopolysiloxane. Examples of this component (D) include tin compounds such as dimethyl tin dineodecanoate and stannous octoate, and the like; titanium compounds such as tetra(isopropoxy)titanium, tetra(n-butoxy)titanium, tetra(t-butoxy)titanium di(isopropoxy)bis(ethylacetoacetate)titanium, di(isopropoxy)bis(methylacetoacetate)titanium, and di(isopropoxy)bis(acetylacetonate)titanium, and the like. The amount used is a catalytic amount, and can be appropriately selected to match the desired curing conditions, but is generally within a range of approximately 0.01 to 5 mass parts, based on 100 mass parts of organopolysiloxane in the entire composition.

The composition of the present invention can appropriately include a curing inhibitor as an optional component for improving the storage stability and the handling workability, such as 2-methyl-3-butyne-2-ol, 3,5-dimethyl-1-hexyn-3-ol, 2-phenyl-3-butyne-2-ol, 1-ethynylcyclohexanol, or similar acetylene-based compounds; 3-methyl-3-pentene-1-yne, 3,5-dimethyl-3-hexene-1-yne, or similar en-yne compounds; 1,3,5,7-tetramethyl-1,3,5,7-tetravinylcyclotetrasiloxane, 1,3,5,7-tetramethyl-1,3,5,7-tetrahexenylcyclotetrasiloxane; benzotriazole or similar triazoles, phosphines, mercaptans, hydrazines, and the like. Moreover, the amount of the cure inhibitor is preferably in a range of 0.001 to 5 mass parts, with regard to 100 mass parts of the organopolysiloxane having a reactive functional group. Incidentally, the curing inhibitor is preferably not included when the present composition is cured at room temperature.

The curable organopolysiloxane composition of the present invention preferably also contains (F) an inorganic filler. The inorganic filler is preferably one or more type of filler selected from reinforcing fillers, heat conductive fillers, and electrically conductive fillers, and in particular, including a reinforcing filler is preferable when the composition of the present invention is used as a protective agent or for adhesive applications.

The reinforcing filler is a component for imparting mechanical strength to the silicone rubber cured product obtained by curing the present composition, and for improving the performance as a protective agent or adhesive. Examples of reinforcing filler include inorganic fillers such as fumed silica fine powder, precipitated silica fine powder, baked silica fine powder, fumed titanium dioxide fine powder, quartz fine powder, calcium carbonate fine powder, diatomaceous earth fine powder, aluminum oxide fine powder, aluminum hydroxide powder, zinc oxide fine powder, and the like; and inorganic fillers where these inorganic fillers have been surface treated with a treating agent such as organoalkoxysilanes like methyltrimethoxysilane, and the like, organohalosilanes such as trimethylchlorosilane and the like, organosilazanes such as hexamethyldisilazane, α,ω-silanol group-blocked dimethyl siloxane oligomers, α,ω-silanol group-blocked methyl phenyl siloxane oligomers, α,ω-silanol group-blocked methyl vinyl siloxane oligomers, and other siloxane oligomers. In particular, excellent initial adhesion, adhesion durability, and adhesive strength can be achieved at low temperature and in a short amount of time, and sufficient handling time (storage time and handling operation time) can be ensured by pre-treating the surface of component (F) with an organopolysiloxane with a low degree of polymerization having a silanol group on both ends of the molecule, preferably a dimethylpolysiloxane capped with a α,ω-silanol group that does not have a reactive functional group other than the silanol group at the terminus of the molecule.

The particle diameter of the fine powder of the reinforcing filler is not particularly restricted, but may be, for example, in the range of 0.01 μm to 1000 μm, based on the median diameter by measuring the laser diffraction/scattering type particle size distribution.

The amount of the reinforcing filler is not restricted, but is preferably in the range of 0.1 to 200 parts by mass, relative to 100 parts by mass of the aforementioned organopolysiloxane.

Heat conductive fillers and electrically conductive fillers are components that provide heat conductivity or electrical conductivity to the silicone rubber cured material obtained by curing the present composition, and examples include: metal fine powder such as gold, silver, nickel, copper, and the like; a fine powder where a metal such as gold, silver, nickel, copper, and the like is vapor deposited or plated on a fine powder surface of ceramic, glass, quartz, organic resin, or the like; metal compounds such as aluminum oxide, aluminum nitrite, zinc oxide, and the like; and mixtures of two or more types of these. Particularly preferable materials include silver powder, aluminum powder, aluminum oxide powder, zinc oxide powder, aluminum nitride powder, and graphite. Furthermore if the present composition is required to have electrical resistance, a metal oxide-based powder or a metal nitride-based powder is preferable, and in particular, an aluminum oxide powder, zinc oxide powder, or aluminum nitride powder is preferable. Furthermore, these heat conductive fillers or electrical conductive fillers are preferably heated and blended with the component (A) under reduced pressure at a temperature of 100 to 200° C. Furthermore, component (A) is an organopolysiloxane containing a group having alkoxysilyl, and a composition with excellent handling and workability can be obtained at a low viscosity even with a high level of filling by surface treating the heat conductive filler or the electrical conductive filler.

The average particle size of the eat conductive filler or the electrical conductive filler is preferably within a range of 1 to 100 μm based on the median diameter, and particularly preferably within a range of 1 to 50 μm.

The composition of the present invention contains components (A) to (D) and an optional inorganic filler or the like as component (F), but preferably also contains (E) an adhesion promoter containing the following components (e1) to (e3). These components (e1) to (e3) will improve the adhesion of the silicone rubber cured product obtained by curing the present composition whether used individually or with only 2 types, but by using the following three types of components in combination, the initial adhesion toward unwashed aluminum diecast and resin materials will be excellent, the adhesive durability and adhesive strength will be further improved even when used in severe environments, and the reliability and durability of electric and electronic components can be maintained for a long period of time. (e1) 100 mass parts of a reaction mixture of an organoalkoxysilane having an amino group and an organoalkoxysilane having an epoxy group; (e2) 10 to 800 mass parts of an organic compound having at least two alkoxysilyl groups in a molecule and having a bond other than a silicone-oxygen bond between these silyl groups; and (e3) a silane having an epoxy group expressed by the general formula: $R^a{}_n Si(OR^b)_{4-n}$ (where $R^a$ represents an organic group having a monovalent epoxy group, $R^b$ represents a hydrogen atom or an alkyl group having 1 to 6 carbon atoms. n represents a number within a range of 1 to 3), or a partially hydrolyzed condensate thereof.

Component (e1) is a reaction mixture containing an organoalkoxysilane having an amino group and an organoalkoxysilane having an epoxy group. This component (e1) is a component for providing initial adhesion to various types of substrates that are in contact during curing, and specifically low temperature adhesion even towards unwashed adherends. Furthermore, a curable system containing a curable composition with the adhesion promoter can also be used as a cross-linking agent. This type of reaction mixture is disclosed in Japanese Examined Patent Application S52-8854 and Japanese Unexamined Patent Application H10-195085.

Examples of the alkoxysilane with an organic group having an amino group that constitutes component (e1) include aminomethyl triethoxysilane, 3-aminopropyltrimethoxysilane, 3-aminopropyltriethoxysilane, 3-aminopropylmethyl dimethoxysilane, N-(2-aminoethyl) aminomethyl tributoxysilane, N-(2-aminoethyl)-3-aminopropyltrimethoxysilane, N-(2-aminoethyl)-3-aminopropylmethyl dimethoxysilane, and 3-anilinopropyl triethoxysilane.

Furthermore, examples of the organoalkoxysilane containing an epoxy group include 3-glycidoxypropyl trimethoxysilane, 3-glycidoxypropylmethyl dimethoxysilane, 2-(3,4-epoxycyclohexyl) ethyl trimethoxysilane, 2-(3, 4-epoxycyclohexyl) ethylmethyl dimethoxysilane.

The molar ratio of the alkoxysilane having an organic group with an amino group and the alkoxysilane having an organic group with an epoxy group is preferably within a range of (1:1.5) to (1:5), and particularly preferably within a range of (1:2) to (1:4). Component (e1) can easily be synthesized by blending the aforementioned alkoxysilane having an organic group with an amino group and the alkoxysilane having an organic group with an epoxy group, and reacting either at room temperature, or while heating.

In particular, with the present invention, when reacting the alkoxysilane having an organic group with an amino group and the alkoxysilane having an organic group with an epoxy group by the method described in Japanese Unexamined Patent Application H10-195085, it is particularly preferable to provide a carbasilatrane derivative expressed by the general formula:

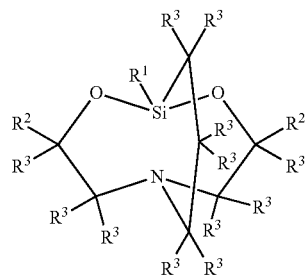
[Formula 16]

{where $R^1$ represents an alkyl group or an alkoxy group, $R^2$ represents the same or different group selected from the group consisting of groups expressed by the general formula:

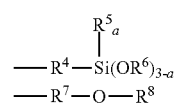
[Formula 17]

(where $R^4$ represents an alkylene group or an alkylenoxyalkylene group, $R^5$ represents a monovalent hydrocarbon group, $R^6$ represents an alkyl group, $R^7$ represents an alkylene group, $R^8$ represents an alkyl group, alkenyl group, or acyl group, and a represents 0, 1, or 2.) and $R^3$ represents the same or different hydrogen atom or alkyl group}. Examples of this type of carbasilatrane derivative include silatrane derivatives having in a molecule an alkenyl group and an alkoxy group that is bonded to a silicon atom, expressed by the following structure.

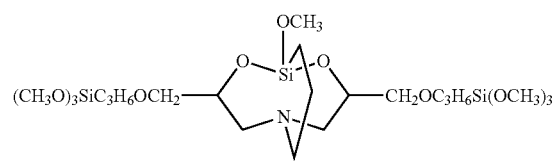
[Formula 18]

Component (e2) is an organic compound that has at least two alkoxysilyl groups in a molecule, and contains a bond other than a silicon-oxygen bond between the silyl groups, and even independently improves the initial adhesion, but in particular, also acts to improve the adhesion durability of a cured material that contains the adhesion promoter in harsh conditions, by concomitant use with component (e1) and component (e3).

In particular, component (e2) is preferably a disilalkane compound expressed by the following general formula:

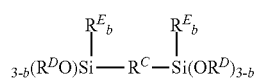
[Formula 19]

(where $R^C$ represents a substituted or unsubstituted alkylene group with 2 to 20 carbon atoms, $R^D$ each independently represent an alkyl group or an alkoxyalkyl group, $R^E$ each independently represent a monovalent hydrocarbon group, and b each independently represent 0 or 1). For component (e2), various types of compounds are commercially available as reagents or products, or if necessary, component (e2) can be synthesized using a commonly known method such as a Grignard reaction or hydrosilylation reaction, or the like. For example, synthesis is possible using a commonly known method of hydrosilylation reacting a diene and a trialkoxysilane or an organodialkoxysilane.

In the formula, $R^E$ represents a monovalent hydrocarbon group such as an alkyl group such as a methyl group, ethyl group, propyl group, and the like; an alkenyl group such as vinyl group, allyl group, and the like; or an aryl group such as a phenyl group, but preferably represents a lower alkyl group. $R^D$ represents an alkyl group such as a methyl group, ethyl group, propyl group, or the like; an alkoxyalkyl group such as a methoxyethyl group or the like, but preferably has 4 or fewer carbon atoms. $R^C$ represents a substituted or unsubstituted alkylene group, and can be a straight chain or branched chain alkylene group, without limitation, and may also be a mixture thereof. From the perspective of improving adhesion, a straight chain and/or branched chain alkylene group with 2 to 20 carbon atoms is preferable, and a straight chain and/or branched chain alkylene with 5 to 10 carbon atoms is preferable, and especially hexylene with 6 carbon atoms. Specific examples of unsaturated alkylene groups include butylene groups, pentylene groups, hexylene groups, heptylene groups, octylene groups, nonylene groups, decylene groups, or branched alkylene groups thereof; and any of the hydrogen atoms can be substituted by a methyl group, ethyl group, propyl group, butyl group, cyclopentyl group, cyclohexyl group, vinyl group, allyl group, 3,3,3-trifluoropropyl group, or 3,3-chloropropyl group.

Specific examples of the component (e2) include bis (trimethoxysilyl) ethane, 1,2-bis (trimethoxysilyl) ethane, 1,2-bis (triethoxysilyl) ethane, 1,2-bis (methyldimethoxysilyl) ethane, 1,2-bis(methyldiethoxysilyl) ethane, 1,1-bis (trimethoxysilyl) ethane, 1,4-bis(trimethoxysilyl) butane, 1,4-bis(triethoxysilyl) butane, 1-methyldimethoxysilyl-4-trimethoxysilyl butane, 1-methyl diethoxysilyl-4-triethoxysilyl butane, 1,4-bis(methyl dimethoxysilyl) butane, 1,4-bis(methyldiethoxysilyl) butane, 1,5-bis(trimethoxysilyl) pentane, 1,5-bis(triethoxysilyl) pentane, 1,4-bis(trimethoxysilyl) pentane, 1,4-bis(triethoxysilyl) pentane, 1-methyldimethoxysilyl-5-trimethoxysilyl pentane, 1-methyldiethoxysilyl-5-triethoxysilyl pentane, 1,5-bis(methyl dimethoxysilyl) pentane, 1,5-bis(methyldiethoxysilyl) pentane, 1,6-bis(trimethoxysilyl) hexane, 1,6-bis(triethoxysilyl) hexane, 1,4-bis(trimethoxysilyl) hexane, 1,5-bis(trimethoxysilyl) hexane, 2,5-bis(tritrimethoxysilyl) hexane, 1-methyl-6-dimethoxysilyl trimethoxysilyl hexane, 1-phenyl-diethoxysilyl-6-triethoxysilyl hexane, 1,6-bis(methyl dimethoxysilyl) hexane, 1,7-bis(trimethoxysilyl) heptane, 2,5-bis(trimethoxysilyl) heptane, 2,6-bis(trimethoxysilyl) heptane, 1,8-bis(trimethoxysilyl) octane, 2,5-bis(trimethoxy silyl) octane, 2,7-bis(trimethoxysilyl) octane, 1,9-bis (trimethoxysilyl) nonane, 2,7-bis(trimethoxysilyl) nonane, 1,10-bis(trimethoxysilyl) decane, and 3,8-bis(trimethoxysilyl) decane. A single type of bis(methoxysilyl)alkane may be used alone or a combination of two or more types may be used. In the present invention, preferable examples include 1,6-bis(trimethoxysilyl) hexane, 1,6-bis(triethoxysilyl) hexane, 1,4-bis(trimethoxysilyl) hexane, 1,5-bis(trimethoxysilyl) hexane, 2,5-bis(trimethoxysilyl) hexane, 1-methyl-dimethoxysilyl-6-trimethoxysilyl-hexane, 1-phenyl diethoxy silyl-6-triethoxysilyl-hexane, and 1,6-bis (methyl-dimethoxysilyl) hexane.

Component (e3) is a silane having an epoxy group expressed by the general formula: $R^a{}_n Si(OR^b)_{4-n}$ (where $R^a$ represents an organic group having a monovalent epoxy group, $R^b$ represents a hydrogen atom or an alkyl group having 1 to 6 carbon atoms. n represents a number within a range of 1 to 3), or a hydrolysate thereof, and even independently improves the initial adhesion, but in particular, also acts to improve the adhesion durability of a cured material that contains the adhesion promoter in harsh conditions such as saltwater immersion or the like, by concomitant use with component (e1) and component (e2). Incidentally, component (e3) is one component of component (e1), but the mass ratio to component (e1) which is a reaction product (typically a carbasilatrane derivative which is a cyclic reaction product) being within a specific range is required from the perspective of the technical effects of the present invention, and therefore component (e3) must be added as a separate component from component (e1).

Furthermore, examples of the silane containing an epoxy group include 3-glycidoxypropyl trimethoxysilane, 3-glycidoxypropylmethyl dimethoxysilane, 2-(3,4-epoxycyclohexyl) ethyl trimethoxysilane, and 2-(3,4-epoxycyclohexyl) ethylmethyl dimethoxysilane.

The aforementioned components (e1) to (e3) are preferably within a specific range or the mass ratio. Specifically, component (e2) is within a range of 10 to 800 mass parts, and component (e3) is within a range of 10 to 800 mass part, with regard to 100 mass parts of component (e1). More preferably, component (e2) is within a range of 25 to 250 mass parts, and component (e3) is within a range of 40 to 750 mass part, with regard to 100 mass parts of component (e1). Furthermore, from the perspective of initial adhesion and adhesion durability, the sum of component (e2) and component (e3) is preferably within a range of 50 to 1000 mass parts, particularly preferably within a range of 70 to 950 mass parts, with regard to 100 mass parts of component (e1). If components (e1) to (e3) are within the aforementioned mass ratio range, the adhesion promoter of (E) will have excellent initial adhesion towards various types of substrates that are in contact during curing, and after curing, will have excellent adhesion durability represented by a saltwater immersion test in particular, and will demonstrate high adhesive strength over a long period of time.

With the adhesion promoter of (E), components (e1) to (e3) can be prepared by blending at the aforementioned mass ratio. Incidentally, the components (e1) to (e3) can be combined individually at the aforementioned mass ratio in the organopolysiloxane composition of the present invention. The amount of these components that is added to the organopolysiloxane composition is not particularly restricted, but the mass of the adhesion promoter (E) which is the sum of components (e1) to (e3) should be within a range of 0.5 to 20 mass % of the curable silicone composition, preferably 1.0 to 10 mass %, and particularly preferably within a range of 1.0 to 5.0 mass %.

Furthermore, the present composition may also contain as an optional cross-linking agent component trifunctional alkoxysilanes such as methyltrimethoxysilane, methyltriethoxysilane, ethyltrimethoxysilane, ethyltriethoxysilane, vinyltrimethoxysilane, and phenyltrimethoxysilane; tetrafunctional alkoxysilanes such as tetramethoxysilane and tetraethoxysilane; and partially hydrolyzed condensates thereof. Furthermore, the present composition may optionally contain, within a range that does not hinder the object of the present invention, organic solvents such as toluene, xylene, acetone, methyl ethyl ketone, methyl isobutyl ketone, hexane, heptane, and the like; non-crosslinkable diorganopolysiloxanes such as dimethylpolysiloxane blocked with α,ω-trimethylsiloxy groups, methylphenylpolysiloxanes blocked by α,ω-trimethylsiloxy groups; flame retardants such as carbon black; antioxidants such as hindered phenol antioxidants; heat resisting agents such as iron oxide and the like; plasticizers such as polydialkylsiloxane oligomers capped on both molecular chain terminals with a hydroxydialkylsiloxy group; and other pigments, thixotropic agents, and antifungal agents.

The curable organopolysiloxane composition of the present invention can be produced by uniformly mixing the organopolysiloxane with 2 different types of curing catalyst, adhesion promoter of the present invention, and other optional components. The method for mixing the components of the organopolysiloxane composition may be a conventional known method and is not particularly limited, but is normally uniform mixing by simple stirring. Furthermore, when solid components such as inorganic fillers or the like are contained as optional components, mixing using a mixing device is more preferable. Such a mixing device is not particularly limited, but is exemplified by a single-screw or twin-screw continuous mixer, twin roller, Ross mixer, Hobart mixer, dental mixer, planetary mixer, kneader mixer, Henschel mixer, and the like.

The curable organopolysiloxane composition of the present invention can be used as a 1 component type curable organopolysiloxane composition, but in order to cause uniform curing on both the surface layer and the inside without relying on the moisture or humidity in the air, the curable organopolysiloxane composition is preferably a multi-component type, and particularly preferably a 2 component type.

More specifically, the present invention may be produced by uniformly mixing components (A) to (D), and, as necessary, components (E) and (F) and other optional components while locking the moisture.

With the case of a 2 component type curable organopolysiloxane composition, the liquid component I contains at least component (C) and component (D), and may optionally contain component (a2), and the liquid component II contains at least component (A) and component (B), and can be stored for long period of time by ceiling these components in a sealed container while blocking humidity, and a silicone rubber can be formed by mixing the liquid component I and the liquid component II while heating to a temperature between room temperature and 50° C. or lower.

The curable organopolysiloxane composition of the present invention favorably adheres to various types of adherends and substrate. Examples of the adherend or substrate include adherends and substrates made from glass, porcelain, mortar, concrete, wood, aluminum, copper, stainless steel, iron, galvanized steel, tin plate, brass, zinc, epoxy resin, phenol resin, and the like. Furthermore, examples also include adherends and substrates made from polycarbonate resin, polyester resin, ABS resin, nylon resin, polyvinyl chloride, polyphenylene sulfide resin, polyphenylene ether resin, polybutylene terephthalate resin, and other thermoplastic resins. Furthermore, if higher strength adhesion is required, the aforementioned adhesion promoter can be added, but in addition, an appropriate primer can be applied to the surface of the adherend or substrate, and then the curable organopolysiloxane composition of the present invention can be applied to the primer coated surface.

The multicomponent curable silicone rubber composition of the present invention is suitable as a member for construction, or as a sealing material, potting material, seal material, or adhesive for electric and electronic components as well as automotive components. Specific examples include sealing agents for attaching glass; sealing members for bathtub units; adhesives and sealing materials for lighting components of vehicles such as automobiles and the like; and protective agents and adhesives for electric and electronic components (sealing material, coating material, potting material, adhesives) and the like.

The curable organopolysiloxane composition of the present invention is useful as a protective agent or adhesive composition particularly for electric and electronic components because of the excellent effect of improving the initial adhesion towards various types of substrates that are in contact during curing, and particularly unwashed aluminum diecast and organic resins such as polybutylene terephthalate (PBT) resin, polyphenylene sulfide (PPS) resin, and the like, and the excellent adhesive durability and high adhesive strength that can be achieved after curing.

The electronic device of the present invention is not particularly limited, so long as it is enclosed or sealed, but examples include electronic devices that contain electrical circuits or electrodes in which metal oxide film electrodes such as indium tin oxide (ITO) are formed, and metal electrodes of silver, copper, aluminum, gold or the like on a substrate such as glass, epoxy resin, polyimide resin, phenolic resin, ceramic or the like. The protective agent or adhesive composition made from the curable organopolysiloxane composition of the present invention has excellent effects for improving the initial adhesion, and can provide excellent adhesive durability and high adhesive strength after curing, and therefore can improve the reliability and durability of electric and electronic components when used for adhering and protecting these electric and electronic components as an adhesive, potting material, coating material, or sealing material, or the like. In particular, use for forming a waterproof structure for an electronic circuit board is favorable.

More specifically, the protective agent or adhesive composition for an electric or electronic component of the present invention is useful as a sealing material for a structure made of metal and/or resin that is required to have durability and water resistance such as peripheral parts of electric and electronic equipment, automotive component cases, terminal boxes, lighting parts, and modules for solar batteries, and for example, can provide excellent initial adhesion and adhesive durability even when applied to a circuit board for power semiconductors such as engine controls and powertrain systems in transportation equipment, air conditioning controls, and the like, as well as storage cases thereof. Furthermore, even when the use under harsh environments such as when incorporated into an automotive electronic device such as an electronic control unit (TCU), excellent adhesive durability will be demonstrated, and thus there is an advantage that the reliability, durability, and water resistance toward rainwater or the like of these power semiconductors or automotive components or the like can be enhanced. The method of use is not restricted in particular, but for example, use in the form of an elastic sealing agent is acceptable for waterproof structures of automotive engine control circuits as described in Japanese Unexamined Patent Application 2007-235013. Similarly, use is possible as a sealing material to protect from water in automobile harnesses with terminals as described in Japanese Unexamined Patent Application 2009-135105, and use is also possible as a water repelling agent for silicone resins in water repelling structures of power lines as well as water repelling methods for power lines, as disclosed in Japanese Unexamined Patent Application 2012-204016. Furthermore, use is also possible as a resin for sealing a solar cell module, or in a method of connecting a solar cell module and a terminal box, as disclosed in Japanese Unexamined Patent Application 2002-170978.

EXAMPLES

The present invention will be described below using practical examples, but the present invention is not limited thereto. Furthermore, the adhesive properties of the curable organopolysiloxane were evaluated by the following method.
<Method of Evaluating Adhesion of the Curable Organopolysiloxane>
A room temperature curable silicone rubber composition was applied in the form of a bead on various substrates such as (alumite treated aluminum sheet (5052P)), aluminum diecast sheet (ADC-12), polybutylene terephthalate (PBT) resin sheet, and polyphenylene sulfide (PPS) resin sheet. Next, the room temperature curable silicone rubber composition was cured by allowing to sit under conditions of a temperature of 23±2° C. and humidity of 50±5%. The silicone rubber that was obtained was peeled from the substrate with a spatula after 1 hour, 3 hours, and 24 hours, and the cohesive failure rate of the silicone rubber was evaluated (ratio of adhesive surface of silicone rubber with cohesive failure with regard to the surface of the adhered part). These results are shown in Table 1. The evaluation criteria for cohesive failure in Table 1 was evaluated as described below.
O: CF ratio is 80% or higher (favorable adhesion)
Δ: CF ratio is within a range of 20 to less than 80% (normal adhesion)
X: CF ratio is less than 20 (poor adhesion)
[Adhesion]
The aforementioned curable organopolysiloxane compositions were interposed at a thickness of 1 mm between 2 unwashed aluminum diecast sheets (ADC-12) or polybutylene terephthalate (PBT) resin sheets, and then cured to form room temperature cured silicone rubber by allowing to sit at a temperature of 23±2° C., humidity 50±5%. After 3 hours or 24 hours, the tensile shear adhesive strength of the adhesive test samples that were obtained were measured in accordance with the method designated in JIS K 6850:1999 "tensile shear adhesive strength test method of adhesives and rigid adherends". Furthermore, the adhered surface was observed, and the cohesive failure rate of the silicone rubber was evaluated (ratio of adhesive surface of a silicone rubber with cohesive failure with regard to the surface of the adhered part). These results are shown in Table 2. The evaluation criteria for cohesive failure in Table 2 was evaluated as described below.
O: CF ratio is 80% or higher (favorable adhesion)
Δ: CF ratio is within a range of 20 to less than 80% (normal adhesion)
X: CF ratio is less than 20 (poor adhesion)
In Table 1, the components used in the examples were as follows. Incidentally, the viscosity was measured at 25° C. using a rotating viscometer. <Liquid component I>
(a2-1) Vi both terminal capped siloxane (1): dimethyl polysiloxane capped on both terminals of the molecular chain with a dimethylvinylsiloxy group (viscosity 2000 mPa·s, Vi content 0.23 mass %)
(a2-2) Vi both terminal capped siloxane (2): dimethyl polysiloxane capped on both terminals of the molecular chain with a dimethylvinylsiloxy group (viscosity 400 mPa·s, Vi content 0.40 mass %)

(a2-3) Vi siloxane resin: siloxane resin expressed by $(CH_2=CH(CH_3)_2SiO_{0.5})_4(CH_3)_3SiO_{0.5})_{40}(SiO_{20})_{56}$, Vi content 0.68 mass %, weighted average molecular weight 20,000 (F1) fumed silica: Fumed silica surface treated with hexamethyl disilazane (surface area 130 m²/g)
(F2) Alumina: Spherical aluminum oxide particles with an average particle diameter of 12 μm
(C) Pt complex: 1,3-divinyl-1,1,3,3-tetramethyl disiloxane complex of platinum (the amount of platinum metal is shown in Table 1 in mass units of ppm with regard to the total amount of organopolysiloxane component in the present composition)
(D) Ti condensation catalyst: di(isopropoxy)bis(ethylacetoacetate) titanium MTMS: methyltrimethoxysilane
<Liquid Component II>
[component (a1): organopolysiloxane containing the following group having alkoxysilyl]

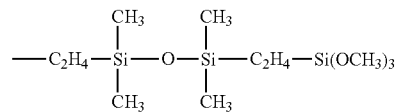

[Formula 20]

(a1-1) polysiloxane modified on both terminals: dimethyl polysiloxane having an alkoxysilyl group on both terminals of the molecular chain (viscosity 40,000 mPa·s) (a1-2) (Vi) siloxane modified on 1 terminal: dimethyl siloxane with an alkoxysilyl group on only one terminal of the molecular chain and capped with a dimethylvinylsiloxy group on the other terminal (viscosity 40,000 mPa·s, Vi content 0.04 mass %) (a1-3) Vi polysiloxane modified on both terminals: dimethyl siloxane capped with a dimethylvinylsiloxy group on both terminals (viscosity 40,000 mPa·s, Vi content 0.08 mass %) Therefore, components (a1-1) to (a1-3) are mixtures obtained by providing 0.8 molar equivalents of siloxane having an alkoxysilyl with regard to the number of vinyl groups on dimethyl siloxane capped with a dimethylvinylsiloxy group on both terminals (viscosity 40,000 mPa·s) in the presence of a hydrosilylation reaction catalyst, and the mass parts indicated in Table 1 are theoretical values.

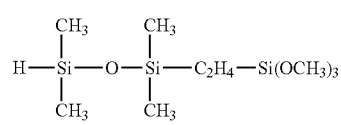

[Formula 21]

(a1-4) polysiloxane modified on both terminals: dimethyl polysiloxane having an alkoxysilyl group on both terminals of the molecular chain (viscosity 10,000 mPa·s) (a1-5) poly (Vi) siloxane modified on 1 terminal: dimethyl siloxane and methyl vinyl siloxane copolymer with an alkoxysilyl group on only one terminal of the molecular chain and capped with a dimethylvinylsiloxy group on the other terminal (viscosity 10,000 mPa·s, Vi content 0.06 mass %) (a1-6) (Vi) siloxane modified on both terminals dimethyl siloxane capped with a dimethylvinyl siloxy group on both terminals of the molecular chain (viscosity 10,000 mPa·s, Vi content 0.12 mass %) Therefore, components (a1-4) to (a1-6) are mixtures obtained by providing siloxane having an alkoxysilyl to make 0.4 molar equivalents with regard to the number of vinyl groups on dimethyl siloxane capped with a dimethylvinylsiloxy group on both terminals of the molecular chain (viscosity 10,000 mPa·s) in the presence of a hydrosilylation reaction catalyst using a hydrosilylation reaction, and the mass parts indicated in Table 1 are theoretical values. (a1-7) polysiloxane modified on both terminals: dimethyl polysiloxane having an alkoxysilyl group on both terminals of the molecular chain (viscosity 400 mPa·s)

(a1-8) poly (Vi) siloxane modified on 1 terminal: dimethyl siloxane and methyl vinyl siloxane copolymer with an alkoxysilyl group on only one terminal of the molecular chain and capped with a dimethylvinylsiloxy group on the other terminal (viscosity 400 mPa·s, Vi content 0.20 mass %) (a1-9) (Vi) siloxane modified on both terminals: dimethyl siloxane capped with an alkoxysilyl group on both terminals of the molecular chain (viscosity 400 mPa·s, Vi content 0.40 mass %) Therefore, components (a1-7) to (a1-9) are mixtures obtained by providing 0.8 molar equivalents of siloxane having an alkoxysilyl with regard to the number of vinyl groups on dimethyl siloxane capped with a dimethylvinylsiloxy group on both terminals (viscosity 400 mPa·s) in the presence of a hydrosilylation reaction catalyst, by using a hydrosilylation reaction, and the mass parts indicated in Table 1 are theoretical values. [Comparative example 1: organopolysiloxane containing a group with alkoxysilyl but not containing a vinyl group]

Polysiloxane modified on both terminals: Dimethyl polysiloxane containing a group with alkoxysilyl on both terminals of the molecular chain (viscosity 40,000 mPa·s) Obtained by providing siloxane containing an alkoxysilyl group so as to be 1.0 molar equivalents with regard to the number of vinyl groups on a dimethylsiloxane capped with a dimethylvinylsiloxy group on both terminals of the molecular chain (viscosity 40,000 mPa·s) in the presence of a hydrosilylation reaction catalyst using a hydrosilylation reaction. Therefore, vinyl groups are not provided in the same molecule. (B1) SiH siloxane: Copolymer of dimethylsiloxane and methyl hydrogen siloxane capped at both terminals of the molecular chain with trimethylsiloxy groups (viscosity: 5 mPa·s, Si—H content: 0.72 mass %) (B2) SiH siloxane: Dimethylsiloxane capped on both terminals of the molecular chain by dimethylhydrogensiloxy groups (viscosity: 5 mPa·s, Si—H content: 0.12 mass %) (B3) SiH siloxane: siloxane: 1,1,5,5-tetramethyl-3,3,-diphenyl tris siloxane (viscosity: 4 mPa·s, Si—H content: 0.60 wt. %)

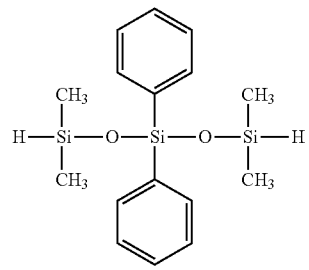

[Formula 22]

<Components of adhesion promoter> (e1) Carbasilatrane: carbasilatrane derivative as expressed by the following formula

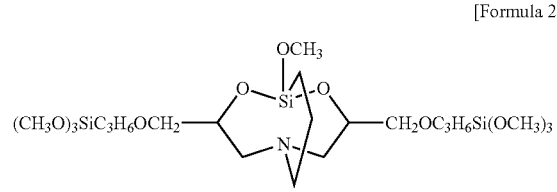

[Formula 23]

(e2) HMSH: 1,6-bis (trimethoxysilyl) hexane
(e3) Ep silane: 3-glycidoxypropyl trimethoxysilane Practical Examples 1 to 6 and Comparative Examples 1 to 3

A 2 liquid component curable organopolysiloxane composition was prepared from liquid I and liquid II with the mass parts (indicated by mass ppm only for Pt complex) indicated in the following Table 1, and cured organopolysiloxane compositions were obtained according to the practical examples and the comparative examples by mixing liquid I and liquid II adding mass ratio of 1:1. The various components are shown in Table 1-1 and Table 1-2. Furthermore, the evaluation results are shown in Table 2-1 and Table 2-2.

TABLE 1-1

| Example/comparison example (mass parts) | Practical Example | | | | | | | |
|---|---|---|---|---|---|---|---|---|
| No. | 1 | 2 | 3 | 4 | 5 | 6 | 7 | 8 |
| <Liquid I> | | | | | | | | |
| (a2-1) siloxane with Vi on both terminals (1) | 21.8 | 21.8 | 21.8 | 21.8 | 21.8 | | 42.8 | 42.8 |
| (a2-2) siloxane with Vi on both terminals (2) | 2.0 | 2.0 | 2.0 | 2.0 | 2.0 | 9.8 | | |
| (a2-3) Vi siloxane resin | 21.0 | 21.0 | 21.0 | 21.0 | 21.0 | | | |
| (F1) Fumed silica | 5 | 5 | 5 | 5 | 5 | | 7 | 7 |
| (F2) Alumina | | | | | | 39.7 | | |
| (D) Ti condensation catalyst | 0.2 | 0.2 | 0.2 | 0.2 | 0.2 | 0.02 | 0.2 | 0.2 |
| MTMS | | | | | | 0.18 | | |
| (C) Pt catalyst (ppm) | 140 | 140 | 140 | 140 | 140 | 15 | 50 | 50 |
| <Liquid II> | | | | | | | | |
| (a1-1) polysiloxane modified on both terminals | 25.1 | | 25.1 | 25.1 | 25.1 | | 12.8 | 12.8 |
| (a1-2) (Vi) siloxane modified on one terminal | 12.6 | | 12.6 | 12.6 | 12.6 | | 6.4 | 6.4 |
| (a1-3) Vi polysiloxane modified on both terminals | 1.6 | | 1.6 | 1.6 | 1.6 | | 0.8 | 0.8 |

TABLE 1-1-continued

| Example/comparison example (mass parts) | Practical Example | | | | | | | |
|---|---|---|---|---|---|---|---|---|
| No. | 1 | 2 | 3 | 4 | 5 | 6 | 7 | 8 |
| (a1-4) polysiloxane modified on both terminals | | 6.3 | | | | | | |
| (a1-5) (Vi) siloxane modified on one terminal | | 18.8 | | | | | | |
| (a1-6) Vi polysiloxane modified on both terminals | | 14.1 | | | | | | |
| (a1-7) polysiloxane modified on both terminals | | | | | | 2.9 | | |
| (a1-8) (Vi) siloxane modified on one terminal | | | | | | 1.5 | | |
| (a1-9) Vi polysiloxane modified on both terminals | | | | | | 4.7 | | |
| (a2-1) siloxane with Vi on both terminals | | | | | | | 20.82 | 21.32 |
| (F1) Fumed silica | 5 | 5 | 5 | 5 | 5 | | 5 | 5 |
| (F2) Alumina | | | | | | 39.7 | | |
| (B1) SiH siloxane | 3.26 | 3.26 | 3.26 | 3.26 | 2.00 | 0.38 | 0.40 | 0.40 |
| (B2) SiH siloxane | | | | | 4.00 | | | |
| (B3) SiH siloxane | | | | | | | 0.76 | 0.76 |
| (e1) Carbasilatrane | 0.5 | 0.5 | 0.5 | 0.5 | 0.5 | 0.1 | | 0.5 |
| (e2) HMSH | 1.0 | 1.0 | 1.0 | | 1.0 | 0.2 | 1.5 | 1.0 |
| (e3) Ep silane | 1.0 | 1.0 | | 1.0 | 1.0 | 0.2 | 1.5 | 1.0 |
| MTMS | | | | | | 0.3 | | |
| 1-ethynyl cyclohexanol | | | | | | | 0.02 | 0.02 |

TABLE 1-2

| Example/comparison example (mass parts) | Comparative Examples | | |
|---|---|---|---|
| No. | 1 | 2 | 3 |
| <Liquid I> | | | |
| (a2-1) siloxane with Vi on both terminals (1) | 21.8 | 21.8 | 21.8 |
| (a2-2) siloxane with Vi on both terminals (2) | 2.0 | 2.0 | 2.0 |
| (a2-3) Vi siloxane resin | 21.0 | 21.0 | 21.0 |
| (F1) Fumed silica | 5 | 5 | 5 |
| (F2) Alumina | | | |
| (D) Ti condensation catalyst MTMS | | 0.2 | 0.2 |
| (C) Pt catalyst (ppm) | 140 | 140 | 140 |
| <Liquid II> | | | |
| (a1-1) polysiloxane modified on both terminals | 25.1 | 19.6 | |
| (a1-2) (Vi) siloxane modified on one terminal | 12.6 | | |
| (a1-3) Vi polysiloxane modified on both terminals | 1.6 | 19.6 | 39.2 |
| (a1-4) polysiloxane modified on both terminals | | | |
| (a1-5) (Vi) siloxane modified on one terminal | | | |
| (a1-6) Vi polysiloxane modified on both terminals | | | |
| (a1-7) polysiloxane modified on both terminals | | | |
| (a1-8) (Vi) siloxane modified on one terminal | | | |
| (a1-9) Vi polysiloxane modified on both terminals | | | |
| (a2-1) siloxane with Vi on both terminals | | | |
| (F1) Fumed silica | 5 | 5 | 5 |
| (F2) Alumina | | | |
| (B1) SiH siloxane | 3.26 | 3.26 | 3.26 |
| (B2) SiH siloxane | | | |
| (B3) SiH siloxane | | | |
| (e1) Carbasilatrane | 0.5 | 0.5 | |
| (e2) HMSH | 1.0 | 1.0 | 1.0 |
| (e3) Ep silane MTMS | 1.0 | 1.0 | 1.0 |
| 1-ethynyl cyclohexanol | | | |

TABLE 2-1

| Practical example/comparative example | | | | Practical Example | | | | | | | |
|---|---|---|---|---|---|---|---|---|---|---|---|
| No. | | | | 1 | 2 | 3 | 4 | 5 | 6 | 7 | 8 |
| PBT | Adhesive strength MPa | 3 Hr | | 0.7 | 2.2 | 0.6 | 0.7 | 1.1 | 0.3 | 0.9 | 0.4 |
| | | 24 Hr | | 0.9 | 2.1 | 1.2 | 1.5 | 1.2 | 1.5 | 1.1 | 1.1 |
| | Cohesion failure rate | 3 Hr | | ○ | ○ | ○ | ○ | ○ | △ | ○ | ○ |
| | | 24 Hr | | ○ | ○ | ○ | ○ | ○ | ○ | ○ | ○ |
| ADC-12 | Adhesive strength MPa | 3 Hr | | 0.5 | 0.6 | 0.4 | 0.5 | 0.7 | 0.2 | 0.4 | 0.2 |
| | | 24 Hr | | 0.9 | 1.3 | 1.6 | 0.9 | 1.7 | 0.5 | 1.5 | 1.7 |
| | Cohesion failure rate | 3 Hr | | ○ | △ | △ | △ | ○ | △ | ○ | ○ |
| | | 24 Hr | | ○ | ○ | ○ | △ | ○ | △ | ○ | ○ |
| A1 (5052P) | 25° C. | 1 Hr | | △ | △ | ○ | △ | △ | △ | ○ | ○ |
| | Cohesion failure rate | 3 Hr | | ○ | ○ | ○ | ○ | ○ | △ | ○ | ○ |
| | | 24 Hr | | ○ | ○ | ○ | ○ | ○ | ○ | ○ | ○ |
| ADC-12 | | | | △ | △ | △ | X | △ | X | △ | △ |
| | | | | ○ | △ | △ | △ | ○ | △ | △ | ○ |
| | | | | ○ | ○ | ○ | △ | ○ | △ | ○ | ○ |
| PBT | | | | ○ | ○ | ○ | △ | ○ | △ | ○ | ○ |
| | | | | ○ | △ | ○ | ○ | ○ | △ | ○ | ○ |
| | | | | ○ | ○ | ○ | ○ | ○ | ○ | ○ | ○ |
| PPS | | | | △ | X | △ | △ | △ | X | △ | △ |
| | | | | △ | △ | △ | △ | ○ | △ | ○ | ○ |
| | | | | ○ | △ | ○ | ○ | ○ | ○ | ○ | ○ |

TABLE 2-2

| Practical example/comparative example | | | Comparative Examples | | |
|---|---|---|---|---|---|
| | No. | | 1 | 2 | 3 |
| PBT | Adhesive strength MPa | 3 Hr | 0.3 | 1.8 | 0.7 |
| | | 24 Hr | 0.3 | 2.2 | 1.4 |
| | Cohesion failure rate | 3 Hr | △ | X | X |
| | | 24 Hr | △ | ○ | X |
| ADC-12 | Adhesive strength MPa | 3 Hr | 0.1 | 0.4 | 0.0 |
| | | 24 Hr | 0.3 | 2.1 | 1.4 |
| | Cohesion failure rate | 3 Hr | X | X | X |
| | | 24 Hr | X | △ | X |
| Al (5052P) | 25° C. | 1 Hr | X | X | X |
| | Cohesion failure rate | 3 Hr | △ | △ | △ |
| | | 24 Hr | △ | ○ | △ |
| ADC-12 | | | X | X | X |
| | | | X | X | X |
| | | | X | △ | X |
| PBT | | | X | X | X |
| | | | △ | X | X |
| | | | △ | ○ | X |
| PPS | | | X | X | X |
| | | | X | X | X |
| | | | X | X | X |

Comparative examples 1 to 3 did not include at least one of a condensation catalyst, an organopolysiloxane containing a vinyl group and a group with alkoxysilyl, or an organopolysiloxane containing a group with alkoxysilyl, and in all cases, the initial adhesion was insufficient. On the other hand, as shown by Practical Examples 1 to 6, a curable organopolysiloxane composition containing an organopolysiloxane containing a group with alkoxysilyl and a vinyl group, an organohydrogen polysiloxane, and a condensation catalyst and hydrosilyl catalyst demonstrated generally favorable initial adhesion in all cases. In particular, the composition of practical example 5 that used two types of organohydrogen polysiloxane demonstrated excellent initial adhesion and adhesive strength toward various types of substrates.

The viscosity of liquid I and liquid II that were repaired in Practical Example 1 was measured at a shear rate of 10 (1/s) using a rheometer (AR2000 produced by DI Instrument Japan Co., Ltd.), and the results are presented in Table 3.

Liquids I and II prepared in Practical Example 1 were blended at a ratio of 1:1, and used to produce a rubber sheet with a thickness of 2 mm using a mold, and this sheet was allowed to sit for 7 days under conditions of a temperature of 23±2° C. and humidity of 50±5%. The physical properties (hardness, tensile strength, elongation) of the rubber sheet were measured in accordance with JIS K 6251. Note, the hardness was measured using a type-A durometer specified by JIS K6253. Furthermore, the fabricated rubber sheet was similarly measured after aging four 500 hours in an environment at 150° C., and the results are presented in Table 3.

Liquid components I and II prepared in Practical Example 1 were blended at a ratio of 1:1, and the test sample that was used in the tensile shear adhesive test was allowed to sit for 24 days under conditions of a temperature of 23±2° C. and humidity of 50±5%. These test samples were then aged for 500 hours in an environment at a temperature of 150° C. or at 85° C. and 85% relative humidity, and then the tensile shear adhesive strength was measured and the results are presented in Table 3.

TABLE 3

| | | | | Practical Example 1 | |
|---|---|---|---|---|---|
| | | | unit | Initial | After 500 hours |
| | Viscosity of liquid I | | Pa · s | 35 | — |
| | Viscosity of liquid II | | Pa · s | 119 | — |
| 150° C. Durability | Elongation | | % | 250 | 220 |
| | Tensile strength | | MPa | 5.4 | 7.0 |
| | Hardness | | — | 47 | 55 |
| | ADC-12 | Adhesive strength | MPa | 0.9 | 2.7 |
| | | Cohesion failure rate | — | ○ | ○ |
| | PBT | Adhesive strength | MPa | 0.9 | 2.5 |
| | | Cohesion failure rate | — | ○ | ○ |
| Durability at 85° C./85% RH | ADC-12 | Adhesive strength | MPa | 0.9 | 2.5 |
| | | Cohesion failure rate | — | ○ | ○ |
| | PBT | Adhesive strength | MPa | 0.9 | 2.5 |
| | | Cohesion failure rate | — | ○ | ○ |

Liquid components I and II prepared in Practical Example 1 were blended at a ratio of 1:1, and the test sample that was used in the tensile shear adhesive test and fabricated by the aforementioned method was heated to 50° C. for 5 minutes, instead of being allowed to sit for 24 hours under conditions of a temperature of 23±2° C. and humidity of 50±5%, and then the tensile shear adhesive strength was measured. The results are presented in Table 4.

TABLE 4

| | | Curing conditions | Practical Example 1 |
|---|---|---|---|
| ADC-12 | Adhesive strength MPa | 50° C./5 minutes | 0.6 |
| | Cohesion failure rate | | △ |
| PBT | Adhesive strength MPa | | 0.9 |
| | Cohesion failure rate | | ○ |

As can be seen from Table 3, a cured material (silicone rubber) made from a curable organopolysiloxane composition of Practical Example 1 generally had a favorable heat resistant mechanical properties and adhesive durability (particularly cohesion failure rate) for a long period of time. Furthermore, as can be seen from Table 4, the curable organopolysiloxane composition of Practical Example 1 had a favorable initial adhesion even when cured for a short period of time at 50° C. for 5 minutes.

INDUSTRIAL APPLICABILITY

The curable organopolysiloxane composition of the present invention is cured by heating and forms a silicone rubber with low hardness, or a silicone rubber with high hardness, demonstrates excellent initial adhesion to various types of unwashed substrates that are in contact during curing, as well as adhesive force and adhesive durability for a long period of time even when used in harsh environments, and can provide favorable adhesion to unwashed aluminum diecast and resin materials and the like even when cured at room temperature of 25° C. if desired, and therefore can be used as a protective agent or adhesive composition for electric and electronic components, and especially as an adhesive agent or sealant for automotive electric and electronic components. Furthermore, the curable organopolysiloxane composition of the present invention, and the protective agent or adhesive composition for electric and electronic components is useful as a protective material for power devices such as motor controls that are used in harsh environments, motor controls for transportation equipment, electrical generating systems, and power devices for aerospace transport systems, and are useful as a protecting material or adhesive for engine controls and powertrains in transportation equipment, standard inverter controls for air-conditioning controllers, automotive electronic components such as electronic control unit (ECU), servomotor control, motor control of industrial equipment and elevators, electric vehicles, hybrid cars, motor control for transportation equipment such as trains, systems for generating electricity such as solar cells, wind, and fuel cells, space transport systems that are used for aerospace, and the like.

The invention claimed is:

1. A curable organopolysiloxane composition comprising:
(A) 100 mass parts of either;
  i) (a1) an organopolysiloxane having, in each molecule thereof, an average of 0.5 alkenyl groups and at least one alkoxysilyl-containing group bonded to a silicon atom and expressed by the general formula:

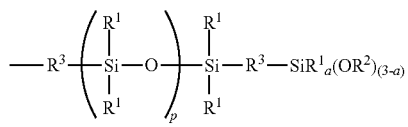

where each $R^1$ represents the same or different monovalent hydrocarbon group without an aliphatic unsaturated bond, $R^2$ represents an alkyl group, each $R^3$ represents the same or different alkylene group, a represents an integer from 0 to 2, and p represents an integer from 1 to 50, or
  ii) a mixture of component (a1) and (a2) an organopolysiloxane having, in each molecule thereof, at least two alkenyl groups but not the alkoxysilyl-containing group, where the amount of component (a1) in the mixture is 10 to less than 100 mass %;
(B) an organopolysiloxane having, in each molecule thereof, at least two silicon-bonded hydrogen atoms, where component (B) is present in an amount such that an amount of silicon-bonded hydrogen atoms in the curable organopolysiloxane composition is 0.3 to 20 with regard to one alkenyl group in component (A);
(C) a catalytic amount of a catalyst for a hydrosilylation reaction;
(D) a catalytic amount of a catalyst for a condensation reaction; and
(E) an adhesion promoter;
wherein component (E) comprises at least two of:
  (e1) a reaction mixture of an organoalkoxysilane having an amino group and an organoalkoxysilane having an epoxy group;
  (e2) an organic compound having at least two alkoxysilyl groups in a molecule and having a bond other than a silicon-oxygen bond between these alkoxysilyl groups; and
  (e3) a silane having an epoxy group expressed by the general formula: $R^a{}_n Si(OR^b)_{4-n}$ where $R^a$ represents an organic group having a monovalent epoxy group, $R^b$ represents a hydrogen atom or an alkyl group having 1 to 6 carbon atoms, and n represents a number within a range of 1 to 3; or a hydrolysate thereof, or a partially hydrolyzed condensate thereof.

2. The curable organopolysiloxane composition according to claim 1, wherein component (E) comprises:
  100 mass parts of component (e1);
  10 to 800 mass parts of component (e2); and
  component (e3).

3. The curable organopolysiloxane composition according to claim 2, wherein component (e3) is present in an amount of from 10 to 800 mass parts per 100 mass parts of component (e1).

4. The curable organopolysiloxane composition according to claim 1, wherein component (a1) is a straight-chain organopolysiloxane having a group containing alkoxysilyl bonded to both molecular terminals and to a silicon atom on a molecular side chain.

5. The curable organopolysiloxane composition according to claim 1, wherein the alkoxysilyl-containing group in component (a1) is expressed by the following formula:

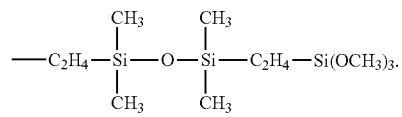

6. The curable organopolysiloxane composition according to claim 1, further comprising (F) an inorganic filler.

7. The curable organopolysiloxane composition according to claim 1, which is room temperature curable.

8. The curable organopolysiloxane composition according to claim 1, which is a two-component type curable organopolysiloxane composition.

9. The two-component type curable organopolysiloxane composition according to claim 8, wherein a liquid component I contains at least component (C) and component (D), and optionally component (a2), and wherein a liquid component II contains at least component (A) and component (B).

10. A protective agent or adhesive composition for electric and electronic components, comprising the curable organopolysiloxane composition according to claim 1.

11. An electric or electronic apparatus, made by sealing or enclosing an electric or electronic component using the curable organopolysiloxane composition according to claim 1.

12. The curable organopolysiloxane composition according to 1, wherein component (a1) has at least two of the alkoxysilyl-containing groups.

13. The curable organopolysiloxane composition according to 12, wherein component (a1) has at least two and not more than 20 of the alkoxysilyl-containing groups.

14. The curable organopolysiloxane composition according to 1, wherein component (a1) has an average of at least 0.5 and not more than 20 alkenyl groups.

15. The curable organopolysiloxane composition according to 1, wherein component (B) is present in an amount of from 0.5 to 50 mass parts per 100 mass parts of component (A).

16. The curable organopolysiloxane composition according to 1, wherein component (E) is present in an amount of from 0.5 to 20 mass %.

17. The curable organopolysiloxane composition according to claim 1, wherein component (E) comprises components (e1), (e2), and (e3).

18. The curable organopolysiloxane composition according to claim 1, comprising:
   i) 100 mass parts of component (e1); and/or
   ii) 10 to 800 mass parts of component (e2); and/or
   iii) 10 to 800 mass parts of component (e3) per 100 mass parts of component (e1); provided at least two of components (e1), (e2), and (e3) are present.

* * * * *